United States Patent
Ishii et al.

(10) Patent No.: US 11,919,032 B2
(45) Date of Patent: Mar. 5, 2024

(54) FILM FORMING APPARATUS AND METHOD FOR MANUFACTURING PART HAVING FILM CONTAINING SILICON

(71) Applicant: TOKYO ELECTRON LIMITED, Tokyo (JP)

(72) Inventors: Takayuki Ishii, Miyagi (JP); Kazuya Nagaseki, Miyagi (JP); Michishige Saito, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/458,691

(22) Filed: Aug. 27, 2021

(65) Prior Publication Data

US 2022/0062943 A1 Mar. 3, 2022

(30) Foreign Application Priority Data

Aug. 28, 2020 (JP) ................................. 2020-144594
Aug. 3, 2021 (JP) ................................. 2021-127198

(51) Int. Cl.
| | |
|---|---|
| *B05C 5/02* | (2006.01) |
| *B05C 11/10* | (2006.01) |
| *B05C 17/005* | (2006.01) |
| *C23C 14/00* | (2006.01) |
| *C23C 16/455* | (2006.01) |

(52) U.S. Cl.
CPC ............ *B05C 5/02* (2013.01); *B05C 11/1013* (2013.01); *B05C 17/00536* (2013.01); *C23C 14/0042* (2013.01); *C23C 14/0063* (2013.01); *C23C 16/45557* (2013.01)

(58) Field of Classification Search
None
See application file for complete search history.

(56) References Cited

U.S. PATENT DOCUMENTS

| | | | | |
|---|---|---|---|---|
| 5,102,620 A | * | 4/1992 | Watson | .................. C23C 4/123 164/463 |
| 5,225,004 A | * | 7/1993 | O'Handley | ............. B22F 3/115 148/540 |
| 5,266,098 A | * | 11/1993 | Chun | ....................... B22F 9/08 75/340 |
| 5,980,637 A | * | 11/1999 | Singh | ................ H01L 21/67115 118/712 |
| 8,701,590 B2 | * | 4/2014 | Kay | ..................... B05B 12/008 118/308 |
| 10,350,616 B2 | * | 7/2019 | Hirano | .................... C23C 24/04 |
| 10,711,636 B2 | * | 7/2020 | Calla | .................... F01D 25/005 |
| 10,730,103 B2 | * | 8/2020 | Hosek | ................. B22D 23/003 |

(Continued)

FOREIGN PATENT DOCUMENTS

JP 2018-48378 A 3/2018

*Primary Examiner* — Jethro M. Pence
(74) *Attorney, Agent, or Firm* — XSENSUS LLP

(57) ABSTRACT

A film forming apparatus is disclosed. The apparatus comprises a chamber; an exhaust unit configured to reduce the pressure in the chamber to a predetermined vacuum level; a holder disposed in the chamber and configured to hold a film forming target member on which a film is to be formed; a supply unit configured to supply a film forming material containing silicon to a surface of the film forming target member; and a heat source configured to perform heating at the predetermined vacuum level to melt the supplied film forming material.

25 Claims, 13 Drawing Sheets

(56) References Cited

U.S. PATENT DOCUMENTS

| | | | | |
|---|---|---|---|---|
| 11,524,315 B2* | 12/2022 | Bang | ............ | H01L 21/6838 |
| 11,623,273 B2* | 4/2023 | Hosek | ............ | B22F 3/115 |
| | | | | 419/26 |
| 2008/0166489 A1* | 7/2008 | Strock | ............ | C23C 28/3215 |
| | | | | 118/300 |
| 2013/0000860 A1* | 1/2013 | Hosek | ............ | H01F 1/24 |
| | | | | 164/514 |
| 2013/0000861 A1* | 1/2013 | Hosek | ............ | B22F 3/115 |
| | | | | 164/271 |
| 2013/0002085 A1* | 1/2013 | Hosek | ............ | C23C 4/18 |
| | | | | 336/221 |
| 2013/0004359 A1* | 1/2013 | Hosek | ............ | B05C 5/002 |
| | | | | 419/29 |
| 2013/0292081 A1* | 11/2013 | Hosek | ............ | B22F 3/1039 |
| | | | | 164/271 |
| 2020/0083080 A1* | 3/2020 | Clark | ............ | H01L 21/28562 |

* cited by examiner

FILM FORMING APPARATUS AND METHOD FOR MANUFACTURING PART HAVING FILM CONTAINING SILICON

CROSS-REFERENCE TO RELATED APPLICATIONS

This application claims priority to and the benefit of Japanese Patent Application Nos. 2020-144594 and 2021-127198 filed on Aug. 28, 2020 and Aug. 3, 2021, respectively, the disclosure of which is incorporated herein by reference in its entirety.

TECHNICAL FIELD

The present disclosure relates to a film forming apparatus and a method for manufacturing a part having a film containing silicon.

BACKGROUND

Japanese Patent Application Publication No. 2018-48378 discloses a method for forming a silicon film by spraying slurry containing silicon particles using a high-speed frame spraying technique.

SUMMARY

The present disclosure provides a technique for forming a film while suppressing oxidation.

A film forming apparatus according to one aspect of the subject disclosure comprises a chamber, an exhaust unit, a holder, a supply unit and a heat source. The exhaust unit is configured to reduce the pressure in the chamber to a predetermined vacuum level. The holder is disposed in the chamber and configured to hold a film forming target member on which a film is to be formed. The supply unit is configured to supply a film forming material containing silicon to a surface of the film forming target member. The heat source is configured to perform heating at the predetermined vacuum level to melt the supplied film forming material.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a film forming apparatus and a method for manufacturing a part having a film containing silicon of the present disclosure will be described in detail with reference to the accompanying drawings. The following embodiments are not intended to limit the film forming apparatus and the method for manufacturing a part having a film containing silicon of the present disclosure.

In a semiconductor manufacturing apparatus, silicon (Si) is used as a material for coating surfaces of components in a chamber. When a silicon film is formed in a non-vacuum state, surfaces of silicon particles are oxidized during the film formation, so that the silicon film may have oxidized portions having a weak adhesive force. Due to the oxidized portions, the silicon particles are easily peeled off from the silicon film which may cause contamination that deteriorates a function of a semiconductor to be manufactured.

Therefore, a new technique for forming a film while suppressing oxidation is anticipated.

First Embodiment (Configuration of Apparatus)

Figure 1:
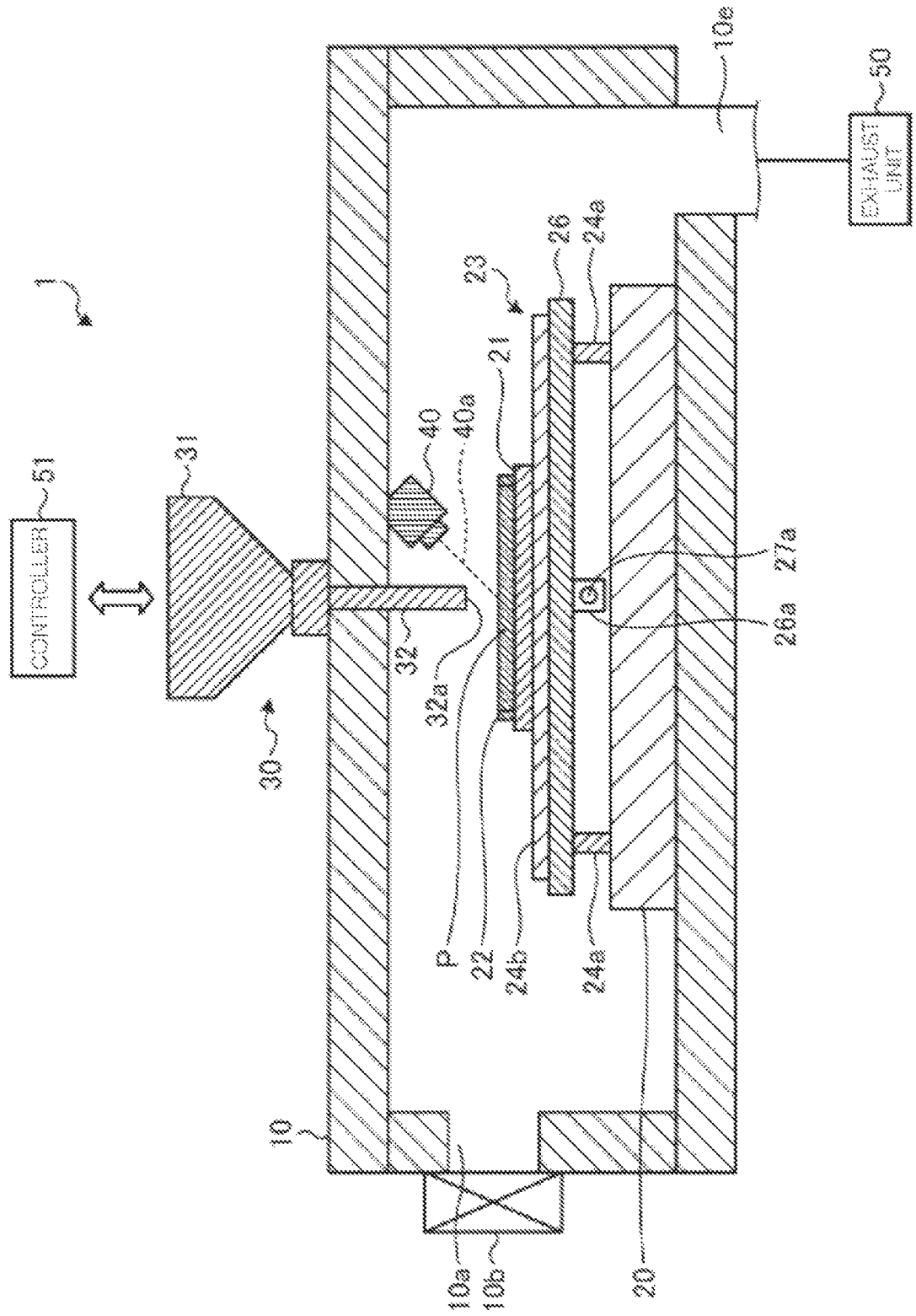
FIG. 1 shows an example of a schematic configuration of a film forming apparatus according to a first embodiment.

A first embodiment will be described. FIG. 1 shows an example of a schematic configuration of a film forming apparatus 1 according to a first embodiment. The film forming apparatus 1 according to the first embodiment includes a chamber 10, a placement table 20, a supply unit 30, a heat source 40, and an exhaust unit 50. The film forming apparatus 1 further includes a controller 51.

The chamber 10 is airtightly sealed, and the pressure in the chamber 10 can be reduced. For example, the chamber 10 is made of a material such as aluminum or the like, and has a rectangular box shape.

The placement table 20 is disposed in a lower area in the chamber 10. The placement table 20 is provided with a holder 21 for holding a film forming target member on which the film is to be formed. Hereinafter, an embodiment will be described in which the film forming target member is a plate-shaped member P and a film is formed on a surface of the member P. The holder 21 is configured to fix the member P. For example, the holder 21 has engaging parts 22 disposed on the side surface the member P, and fixes and holds the member P by interposing the side surface of the member P between the engaging parts 22.

The placement table 20 is provided with a driving unit for driving the holder 21. The driving unit 23 is configured to be able to move the holder 21 on the upper surface of the placement table 20. For example, on the upper surface of the placement table 20, a pair of guide rails 24a and a ball screw 27a are disposed in line along one direction (the direction perpendicular to the plane of FIG. 1). A movable base 26 is disposed on the guide rails 24a. A nut 26a engaged with the ball screw 27a is fixed to the movable base 26. A driving mechanism such as a motor, a gear, or the like for rotating the ball screw 27a is disposed at an end of the ball screw 27a. The movable base 26 is movable along the guide rail 24a by the rotation of the ball screw 27a using a driving force of the motor. On the movable base 26, a pair of guide rails 24b and a ball screw (not shown) are disposed in line along a direction intersecting with said one direction (the right-left direction in FIG. 1). The holder 21 is disposed on the guide rail 24b. A nut engaged with the ball screw is fixed to the holder 21. A driving mechanism, such as a motor for rotating the ball screw, a gear, or the like, is disposed at an end of the ball screw. The holder 21 is movable in said direction intersecting with said one direction along the guide rail 24b by the rotation of the ball screw using a driving force of the motor. Since the movable base 26 on which the holder 21 is placed moves in one direction and the holder 21 moves in a direction intersecting with said one direction, the holder 21 is movable in two directions on the upper surface of the placement table 20. The configuration of the driving unit 23 is not limited thereto. The driving unit 23 may have any configuration as long as the holder 21 is movable on the upper surface of the placement table 20.

A supply unit 30 is disposed above the placement table 20. The supply unit 30 is airtightly disposed at the ceiling portion of the chamber 10. The supply unit 30 has an accommodating part 31 that accommodates a film forming material. Hereinafter, an embodiment in which a silicon film is formed on the member P using silicon as a film forming material will be described. Powder silicon is stored as the film forming material in the accommodating part 31. A cylindrical part 32 is connected to a lower portion of the accommodating part 31. The cylindrical part 32 communicates with the accommodating part 31, and the lower end thereof serves as a supply port 32a. The powder silicon accommodated in the accommodating part 31 is supplied into the chamber 10 through the cylindrical part 32, and falls on the member P from the supply port 32a.

A heat source 40 for heating and melting the film forming material is disposed in the chamber 10. The heat source 40 can heat the film forming material even in a vacuum state. An electron beam, laser light, or the like can be used as the heat source capable of heating the film forming material even in the vacuum state. The heat source 40 emits an electron beam or laser light. In the following embodiment, the heat source 40 emits an electron beam 40a. However, the heat source 40 may emit laser light. The heat source 40 is disposed such that the emitted electron beam 40a reaches a spot on the surface of the member P to which the film forming material is supplied from the supply unit 30. In other words, in the first embodiment, the heat source 40 is disposed such that the electron beam 40a reaches the position located under the supply port 32a on the surface of the member P. Although the heat source 40 is disposed in the chamber 10 in FIG. 1, the present disclosure is not limited thereto. The heat source for emitting an electron beam or laser light may be disposed outside the chamber 10, and the electron beam or the laser light emitted from the heat source may be guided into the chamber 10 by a light guide member such as a mirror, a lens, a transmission window, an optical fiber, or the like so as to be irradiated to the member P.

The exhaust unit 50 may be connected to an exhaust port 10e disposed at a bottom portion of the chamber 10, for example. The exhaust unit 50 may include a pressure valve and a vacuum pump. The vacuum pump may include a turbo molecular pump, a roughing pump, or a combination thereof.

An opening 10a for loading/unloading the member P is disposed on a sidewall of the chamber 10. The opening 10a can be opened and closed by a gate valve 10b.

The controller 51 processes computer-executable instructions for causing the film forming apparatus 1 to execute various processes described in the present disclosure. The controller 51 may be configured to control individual components of the film forming apparatus 1 to execute various processes described herein. The controller 51 includes, e.g., a computer.

As described above, silicon is used as a material for coating surfaces of components in the chamber of the semiconductor manufacturing apparatus. However, in the case of forming a film using a material that is easily oxidized, such as silicon, by a non-vacuum process such as spraying, it is difficult to prevent surfaces of silicon particles from being oxidized when silicon is melted, and, thus oxidized portions having a weak adhesive force are formed in the formed silicon film. The oxidized portions may be peeled off, and the peeled-off silicon particles may cause contamination that deteriorates a function of a semiconductor to be manufactured.

Conventionally, even in the case of spraying, the oxidation is prevented by reducing the pressure or replacing with an inert gas. However, an oxygen concentration in the atmosphere cannot be reduced to a level at which silicon is not oxidized, and a technical objective for forming a film while suppressing oxidation remains.

Therefore, the film forming apparatus 1 forms a silicon film using a film forming method to be described below.

Figure 10:
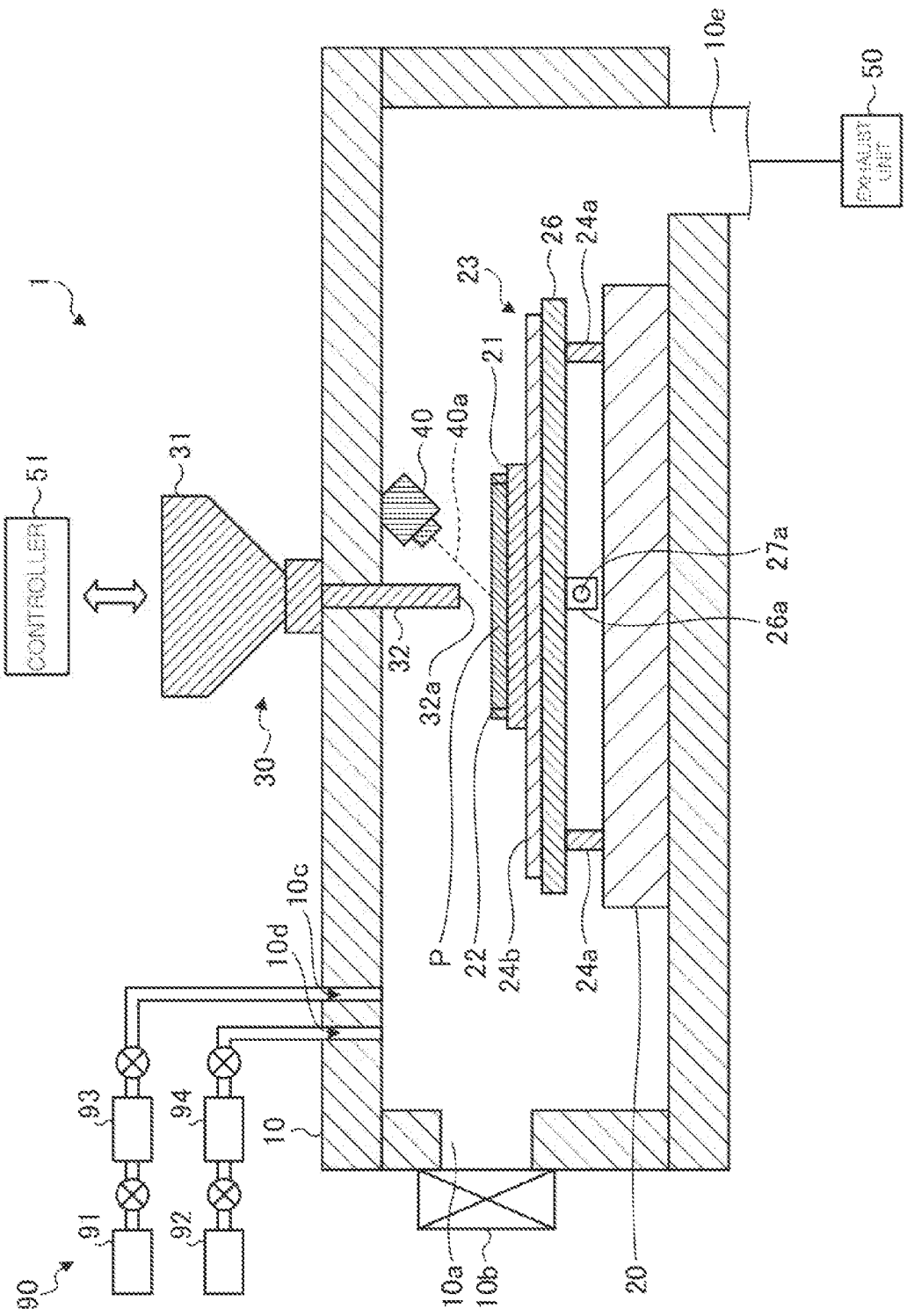
FIG. 10 shows another example of the schematic configuration of the film forming apparatus according to the first embodiment.

The member P as a film forming target member is transferred into the chamber 10 from the opening 10a and placed on the holder 21. In the film forming apparatus 1, the member P placed on the holder 21 is held by the holder 21. In the film forming apparatus 1, the gate valve 10b is closed, and the exhaust unit 50 is driven to reduce the pressure in the chamber 10 to a predetermined vacuum level. For example, in the film forming apparatus 1, the pressure in the chamber 10 is reduced to a level higher than or equal to $10^{-6}$ Torr and lower than $10^{-2}$ Torr, and more preferably to a level higher than or equal to $10^{-5}$ Torr and lower than $10^{-3}$ Torr. If the oxidation can be prevented by introducing a reducing gas or the like into the chamber 10 and forming a film in a reducing gas atmosphere after or while reducing the pressure in the chamber 10, the pressure in the chamber 10 may be $10^{-3}$ Torr or more. FIG. 10 shows another example of the schematic configuration of the film forming apparatus 1 according to the first embodiment. The film forming apparatus shown in FIG. 10 shows a case where the film forming apparatus 1 shown in FIG. 1 is provided with a gas supply system 90 for supplying a reducing gas and a dilution gas. The gas supply system 90 includes a reducing gas supply source 91 and a dilution gas supply source 92 for supplying the dilution gas. The chamber 10 is provided with gas introduction ports 10c and 10d. The reducing gas supply source 91 is configured to supply the reducing gas to the gas introduction port 10c via a flow controller 93, and to introduce the reducing gas into the chamber 10 from the gas introduction port 10c. The dilution gas supply source 92 is configured to supply the dilution gas to the gas introduction port 10d via a flow controller 94, and to introduce the dilution gas into the chamber 10 from the gas introduction port 10d. The film forming apparatus 1 may perform the following film formation in a reducing gas atmosphere by supplying the reducing gas from at least the reducing gas supply source 91 and introducing the reducing gas into the chamber 10 after or while reducing the pressure in the chamber 10. The reducing gas is, for example, a gas containing at least one gas selected from CO gas, $H_2$ gas, $CH_4$ gas, $C_3H_8$ gas, $C_4H_{10}$ gas or the like. In addition, by further supplying a noble gas such as Ar gas, which is the dilution gas, from the dilution gas supply source 92 and introducing the noble gas into the chamber 10, that is, by introducing a gas in which the reducing gas and the noble gas are combined into the chamber 10, the following film formation may be performed.

Figure 2:
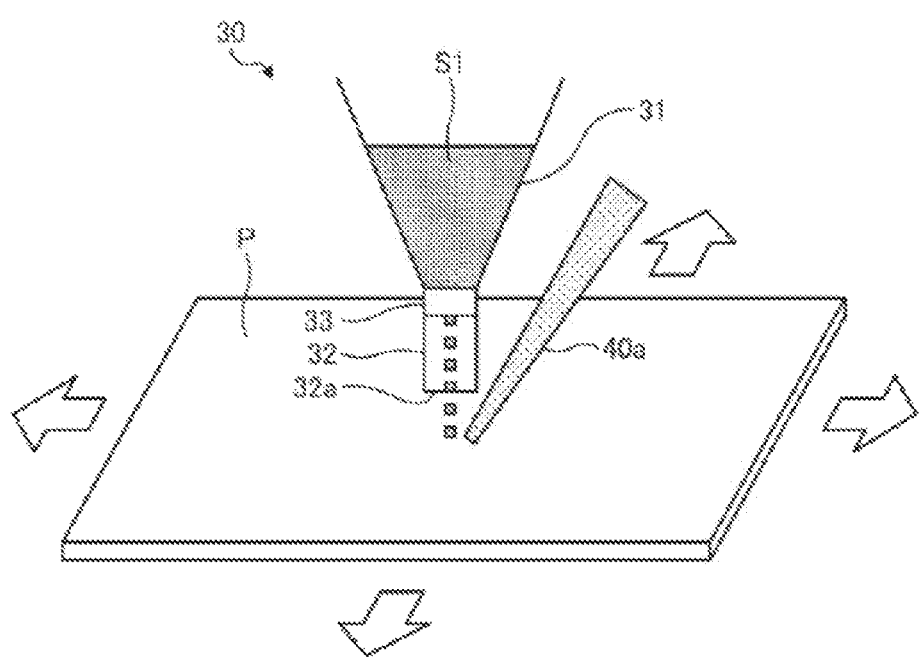
FIG. 2 explains an outline of film formation performed by the film forming apparatus according to the first embodiment.

In the film forming apparatus 1, the film forming material is supplied from the supply unit 30 to the surface of the member P, and the supplied film forming material is melted by the heat source 40 to form a film. FIG. 2 explains an outline of film formation performed by the film forming apparatus 1 according to the first embodiment. In FIG. 2, the accommodating part 31 and the cylindrical part 32 constituting the supply unit 30 are illustrated. The accommodating part 31 has a conical shape such that the width of an inner space for accommodating powder silicon S1 becomes gradually narrower downwards, and the powder silicon S1 is accommodated in the accommodating part 31. The cylindrical part 32 communicating with the inner space is connected to the lower portion of the accommodating part 31. A diaphragm mechanism 33 capable of changing the size of its opening is disposed where the accommodating part 31 is connected with the cylindrical part 32. The supply unit 30 can adjust a supply amount of the powder flowing from the accommodating part 31 to the cylindrical part 32 by changing the size of the opening using the diaphragm mechanism 33. Further, the pressure in the accommodating part 31 may be reduced as well to prevent the supply amount of powder from being affected by the pressure.

The silicon S1 flowing into the cylindrical part 32 freely falls from the supply port 32a and is supplied to the surface of the member P. The heat source 40 irradiates the electron beam 40a to the position located under the supply port 32a on the surface of the member P. Accordingly, the silicon S1 that has fallen from the supply port 32a is heated and melted by the electron beam 40a emitted from the heat source 40, thereby forming a silicon film.

The member P is configured to be movable on the upper surface of the placement table 20 by the driving unit 23. The film forming apparatus 1 forms a silicon film on the surface of the member P while moving the spot where the silicon film will be formed on the member P by way of moving the holder 21 holding the member P using the driving unit 23.

In this manner, the film forming apparatus 1 according to the first embodiment can form a silicon film in the depressurized chamber 10 while suppressing oxidation of the silicon. As a result, the film forming apparatus 1 can manufacture a part having a film containing silicon while suppressing oxidation of the silicon.

Figure 3:
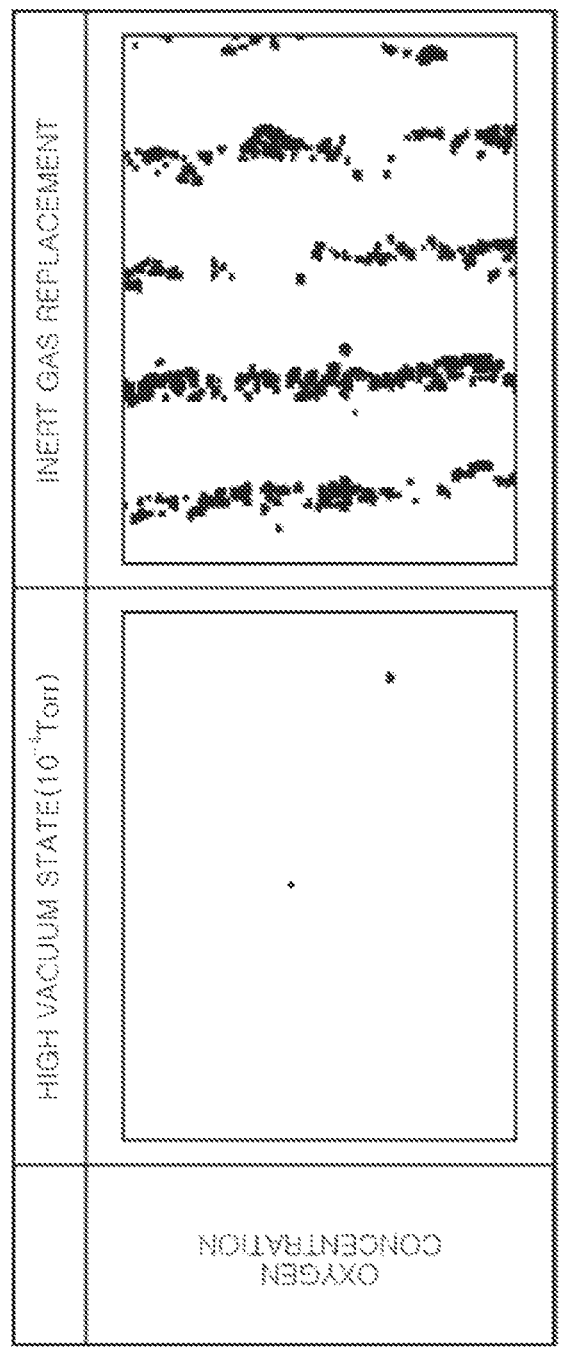
FIG. 3 shows an example of a result of formation of a silicon film according to an embodiment.

FIG. 3 shows an example of a result of formation of a silicon film according to silicon film formation according to an embodiment. In FIG. 3, a silicon film formed by reducing the pressure in the chamber 10 to $10^{-4}$ Torr in the film forming apparatus 1 is illustrated as "high vacuum state". Further, in FIG. 3, as a reference example, a silicon film formed by replacement with an inert gas is illustrated as "inert gas replacement". In FIG. 3, the oxidized portions of the silicon film are shown in black. The oxidized portions of the silicon film were checked by mapping of oxygen atoms using energy dispersive X-ray analysis (EDX analysis). As shown in FIG. 3, the oxidized portions shown in black are fewer in the silicon film illustrated as "high vacuum state" than in the silicon film illustrated as "inert gas replacement". In this manner, the film forming apparatus 1 can form a silicon film while suppressing oxidation. Accordingly, the contamination in the semiconductor manufacturing apparatus can be suppressed by coating the silicon film on the surfaces of the components in the chamber of the semiconductor manufacturing apparatus using the film forming apparatus 1, for example.

Here, a method of forming a silicon film in the depressurized chamber 10 may be physical vapor deposition (PVD) or chemical vapor deposition (CVD). The PVD and the CVD are vacuum processes, and thus are useful as a method of forming a film while preventing oxidation. However, in the PVD or the CVD, it is difficult to form a film of 10 μm or more, and it is also difficult to form a thick film which is highly demanded for coating consumable parts.

On the other hand, the film forming apparatus 1 can form a film of several hundreds μm or more without oxidizing a material that is easily oxidized, such as silicon. The member P as a film forming target member is, e.g., a consumable part such as a component in the chamber of a semiconductor manufacturing apparatus. The consumable part may be an edge ring, an upper electrode, an exhaust ring, a deposition shield, or the like. Accordingly, the film forming apparatus 1 according to the embodiment can form a thick silicon film on the consumable parts, such as the components in the chamber of the semiconductor manufacturing apparatus.

As described above, the film forming apparatus 1 according to the first embodiment includes the chamber 10, the exhaust unit 50, the holder 21, the supply unit 30, and the heat source 40. The exhaust unit 50 decreases the pressure in the chamber 10 to a predetermined vacuum level. The holder 21 is disposed in the chamber 10 to hold the film forming target member (the member P). The supply unit 30 supplies a film forming material containing silicon (silicon S1) to the surface of the film forming target member. The heat source 40 can perform heating at a predetermined vacuum level to melt the supplied film forming material. Accordingly, the film forming apparatus 1 can form a film while suppressing oxidation. Further, the film forming apparatus 1 can form a thick film.

The film forming apparatus 1 according to the first embodiment further includes the driving unit 23. The heat source 40 heats a spot on the surface of the film forming target member where the film forming material is supplied from the supply unit 30. The driving unit 23 drives the holder 21 such that the spot where the film forming material is supplied moves on the surface of the film forming target member. Hence, the film forming apparatus 1 can form a film on the surface of the film forming target member while suppressing oxidation.

The exhaust unit 50 reduces the pressure in the chamber 10 to a level higher than or equal to $10^{-6}$ Torr and lower than $10^{-2}$ Torr, and more preferably to a level higher than or equal to $10^{-5}$ Torr and lower than $10^{-3}$ Torr. Therefore, the film forming apparatus 1 can form a film while suppressing oxidation. Further, after or while reducing the pressure in the chamber 10, by introducing the reducing gas or the like into the chamber 10 from the gas introduction ports 10c and 10d and melting the film forming material in the reducing gas atmosphere to form a film, it is possible to form the silicon film while suppressing oxidation of silicon.

The heat source 40 outputs an electron beam or laser to melt the film forming material. Accordingly, even when the chamber 10 is in a vacuum state having a pressure higher than or equal to $10^{-6}$ Torr and lower than $10^{-2}$ Torr, the film forming material can be melted, so that the film forming apparatus 1 can form a film on the film forming target member.

The film forming material is silicon. Thus, the film forming apparatus 1 can form a silicon film having high resistance to plasma on the surface of the film forming target member.

The supply unit 30 supplies the film forming material made of a powder. The supply unit 30 accommodates the powder film forming material in the accommodating part 31 disposed above the holder 21 and having a shape that the width thereof becomes gradually narrower downwards, and supplies the powder film forming material from the supply port 32a disposed under the accommodating part 31 and communicating with the accommodating part 31. Accordingly, the film forming apparatus 1 can form a film on the surface of the film forming target member while suppressing oxidation even in the case of using a powder film forming material.

Second Embodiment

Figure 4:
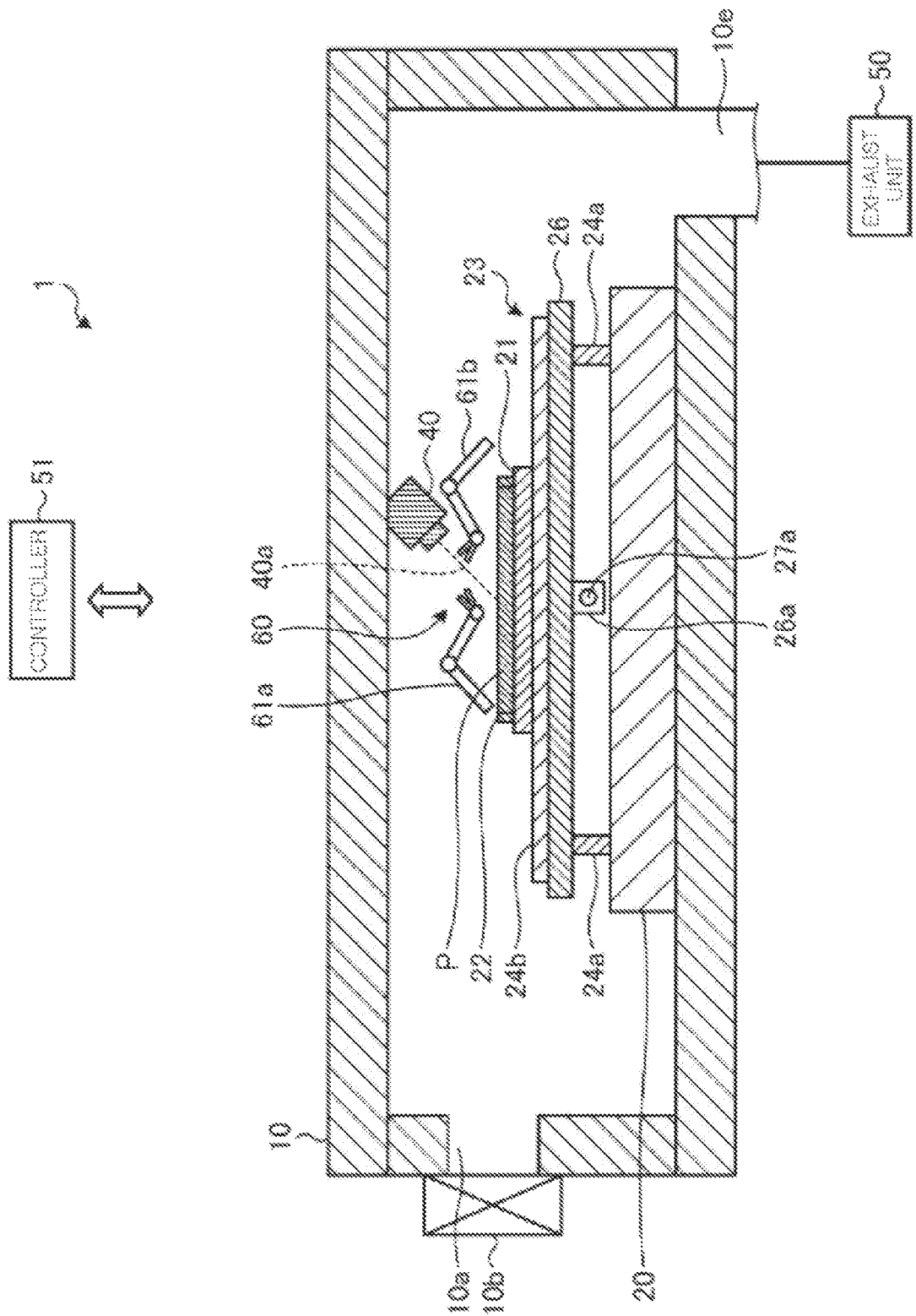
FIG. 4 shows an example of a schematic configuration of a film forming apparatus according to a second embodiment.

Next, a second embodiment will be described. FIG. 4 shows an example of a schematic configuration of a film forming apparatus 1 according to a second embodiment. Since the film forming apparatus 1 according to the second embodiment has the same configuration in part as that of the film forming apparatus 1 according to the first embodiment shown in FIG. 1, like reference numerals will be used for like parts. The redundant description will be omitted, and differences will be mainly described. The film forming apparatus 1 according to the second embodiment includes a supply unit 60 for supplying a film forming material.

The film forming apparatus 1 according to the second embodiment includes a plurality of robot arms serving as the supply unit 60. In the example of FIG. 4, two robot arms 61a and 61b serving as the supply unit 60 are provided in the chamber 10. In the present embodiment, the film forming material has a rod shape. The supply unit 60 supplies the rod-shaped film forming material. For example, the robot arms 61a and 61b hold the rod-shaped silicon and bring the rod-shaped silicon into contact with the surface of the member P.

The heat source 40 is disposed such that the electron beam 40a emitted therefrom reaches the spot on the surface of the member P where the rod-shaped film forming material is supplied from the supply unit 60. For example, the heat source 40 is disposed such that the electron beam 40a reaches a contact spot on the surface of the member P which will be in contact with the rod-shaped silicon, and irradiates the electron beam 40a to the contact spot.

The supply unit 60 may bring the rod-shaped silicon into contact with the surface of the member P, or may supply the rod-shaped silicon to the vicinity of the surface of the member P without bringing the rod-shaped silicon into contact with the surface of the member P. When the rod-shaped silicon is not in contact with the surface of the member P, the electron beam 40a may be irradiated to the tip end of the rod-shaped silicon so that the melted silicon falls on the member P to form a film.

Figure 11:
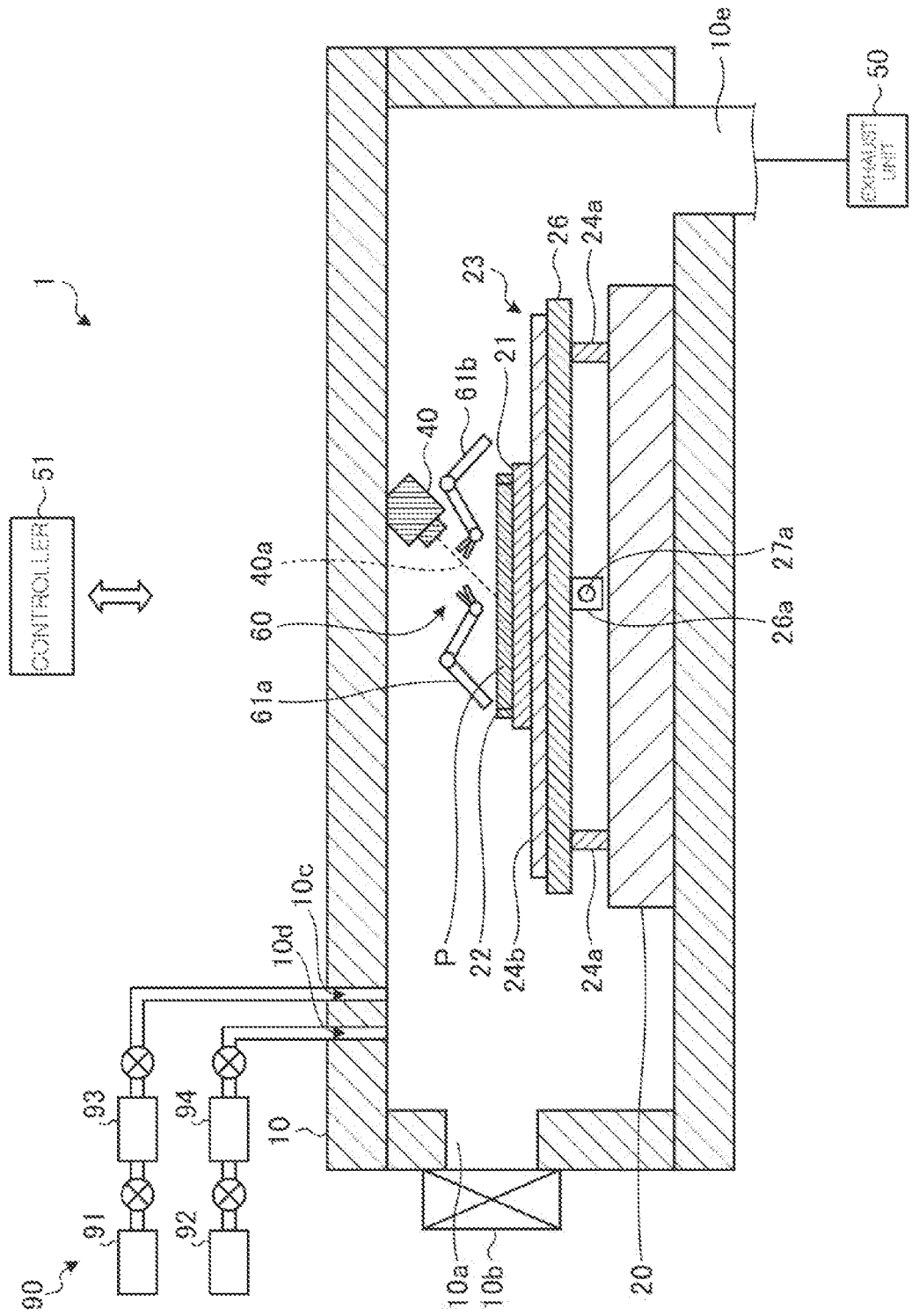
FIG. 11 shows another example of the schematic configuration of the film forming apparatus according to the second embodiment.

In the case of forming a silicon film on the member P as a film forming target member using the film forming apparatus 1 according to the second embodiment, the member P is transferred into the chamber 10 from the opening 10a and placed on the holder 21. In the film forming apparatus 1, the member P placed on the holder 21 is held by the holder 21. In the film forming apparatus 1, the gate valve 10b is closed, and the exhaust unit 50 is driven to reduce the pressure in the chamber 10 to a predetermined vacuum level. For example, in the film forming apparatus 1, the pressure in the chamber 10 is reduced to a level higher than or equal to $10^{-6}$ Torr and lower than $10^{-2}$ Torr, and more preferably to a level higher than or equal to $10^{-5}$ Torr and lower than $10^{-3}$ Torr. If the oxidation can be prevented by introducing the reducing gas or the like into the chamber 10 and forming a film in the reducing gas atmosphere after or while reducing the pressure in the chamber 10, the pressure in the chamber 10 may be $10^{-3}$ Torr or more. FIG. 11 shows another example of the schematic configuration of the film forming apparatus 1 according to the second embodiment. The film forming apparatus 1 shown in FIG. 11 shows a case where the film forming apparatus 1 shown in FIG. 4 is provided with the gas supply system 90 having the same configuration as that of FIG. 10. The reducing gas supply source 91 is configured to supply the reducing gas to the gas introduction port 10c via the flow controller 93, and to introduce the reducing gas into the chamber 10 from the gas introduction port 10c. The dilution gas supply source 92 is configured to supply the dilution gas to the gas introduction port 10d via the flow controller 94, and to introduce the dilution gas into the chamber 10 from the gas introduction port 10d. The film forming apparatus 1 may perform the following film formation in the reducing gas atmosphere by supplying the reducing gas from at least the reducing gas supply source 91 and introducing the reducing gas into the chamber 10 after or while reducing the pressure in the chamber 10. The reducing gas is, for example, a gas containing at least one gas selected from CO gas, $H_2$ gas, $CH_4$ gas, $C_3H_8$ gas, $C_4H_{10}$ gas or the like. In addition, by further supplying a noble gas such as Ar gas, which is the dilution gas, from the dilution gas supply source 92 and introducing the noble gas into the chamber 10, that is, by introducing a gas in which the reducing gas and the noble gas are combined into the chamber 10, the following film formation may be performed.

Figure 5:
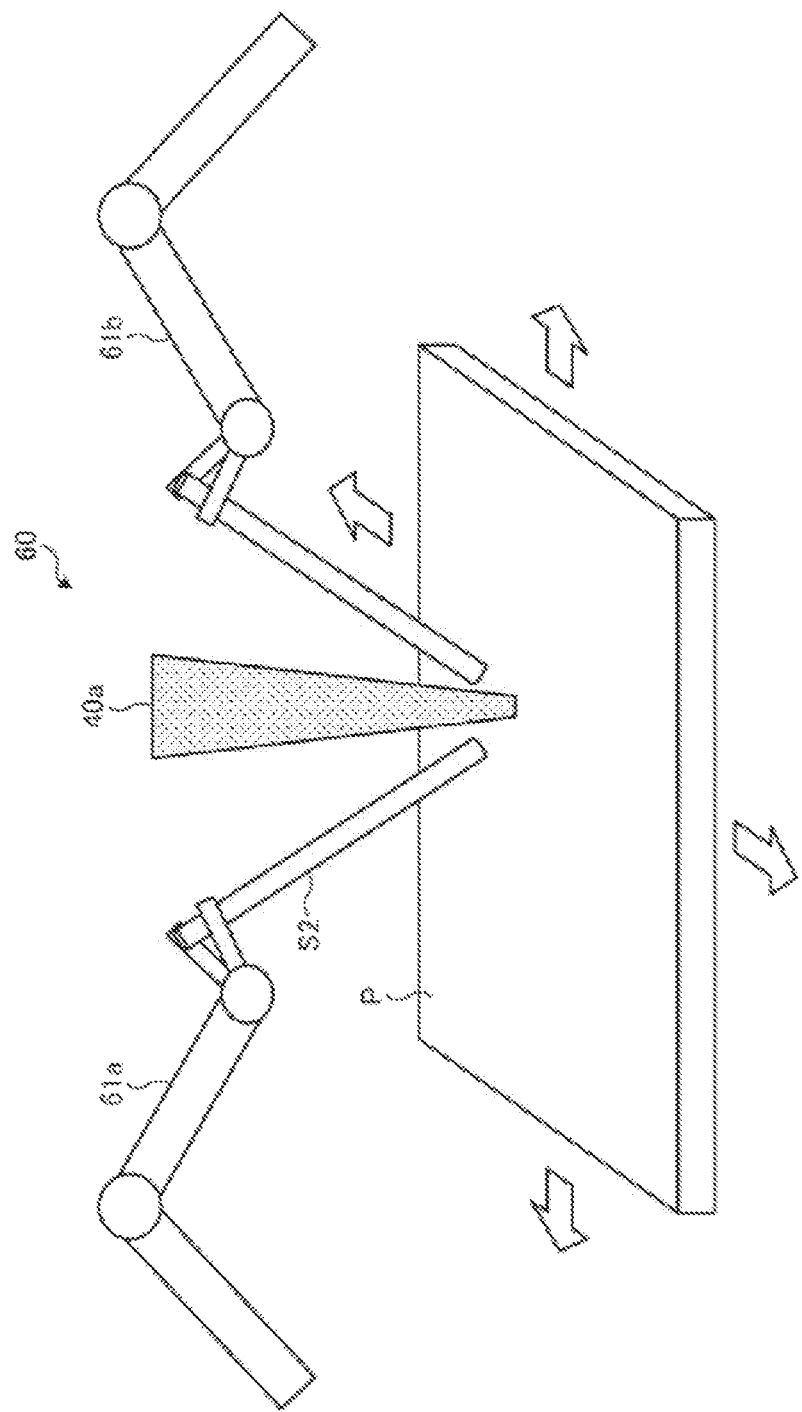
FIG. 5 explains an outline of film formation performed by the film forming apparatus according to the second embodiment.

In the film forming apparatus 1, the film forming material is supplied from the supply unit 60 to the surface of the member P, and the supplied film forming material is melted by the heat source 40 to form a film. FIG. 5 explains an outline of film formation performed by the film forming apparatus 1 according to the second embodiment. In FIG. 5, two robot arms 61a and 61b constituting the supply unit 60 are illustrated. The robot arms 61a and 61b hold rod-shaped silicon rods S2 and bring them into contact with the surface of the member P. The robot arms 61a and 61b alternately bring the silicon rods S2 into contact with the surface of the member P to constantly supply silicon. For example, one of the robot arms 61a and 61b brings a silicon rod S2 into contact with the surface of the member P to supply silicon. When the length of the silicon rod S2 supplied by said one robot arm becomes shorter than or equal to a predetermined length, the other robot arm brings another silicon rod S2 into contact with the surface of the member P to supply silicon. One robot arm replaces the silicon rod S2 having a length shorter than or equal to the predetermined length with a new silicon rod S2. The length of the silicon rod S2 is detected from a position of a tip end of the robot arm holding the silicon rod S2. In the film forming apparatus 1 according to the second embodiment, a plurality of silicon rods S2 are disposed in advance in the chamber 10 for replacement.

The silicon rod S2 is supplied to the surface of the member P by the robot arms 61a and 61b. The heat source 40 irradiates the electron beam 40a to a spot where the silicon rod S2 is in contact with the surface of the member P. Thus, the silicon rod S2 is heated and melted by the electron beam 40a emitted from the heat source 40, thereby forming a silicon film.

The member P is configured to be movable on the upper surface of the placement table 20 by the driving unit 23. The film forming apparatus 1 forms a silicon film on the surface of the member P while moving the spot where the silicon film will be formed on the member P by moving the holder 21 holding the member P using the driving unit 23.

In this manner, the film forming apparatus 1 according to the second embodiment can form a silicon film in the depressurized chamber 10 while suppressing oxidation of silicon. Further, after or while reducing the pressure in the chamber 10, by introducing the reducing gas or the like into the chamber 10 from the gas introduction ports 10c and 10d and melting the film forming material in the reducing gas atmosphere to form a film, it is possible to form the silicon film while suppressing oxidation of silicon.

As described above, the supply unit 60 supplies the rod-shaped film forming material (the silicon rod S2). The supply unit 60 supplies the film forming material from one or more directions. The supply unit 60 grips and supplies the rod-shaped film forming material using the plurality of robot arms 61a and 61b. Accordingly, the film forming apparatus 1 can form a film on the surface of the film forming target member while suppressing oxidation even in the case of using a rod-shaped film forming material.

Third Embodiment

Figure 6:
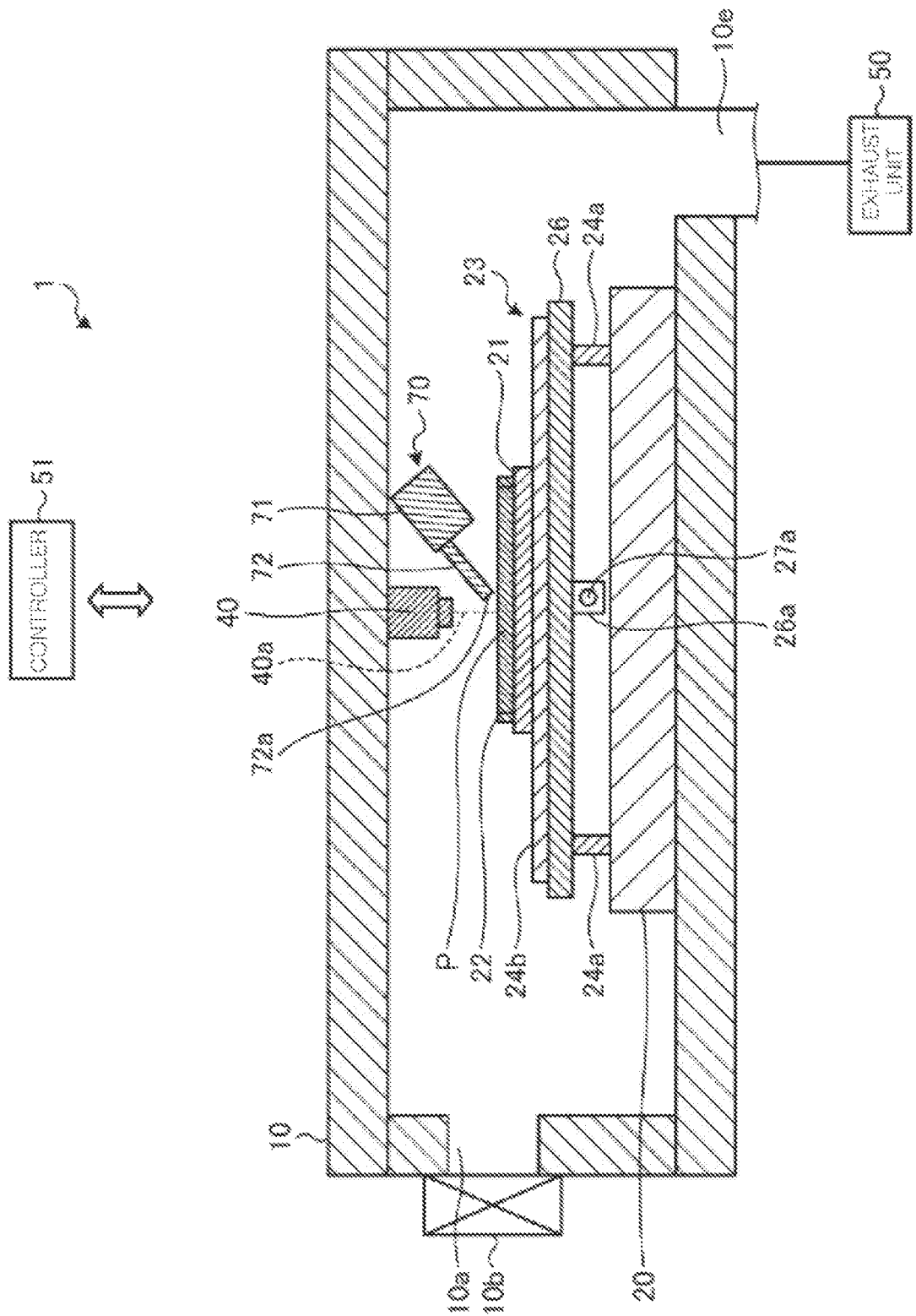
FIG. 6 shows an example of a schematic configuration of a film forming apparatus according to a third embodiment.

Next, a third embodiment will be described. FIG. 6 shows an example of a schematic configuration of a film forming apparatus 1 according to the third embodiment. Since the film forming apparatus 1 according to the third embodiment has the same configuration in part as that of the film forming apparatuses 1 according to the first and second embodiments shown in FIGS. 1 and 4, like reference numerals will be used for like parts. The redundant description will be omitted, and differences will be mainly described. The film forming apparatus 1 according to the third embodiment includes a supply unit 70 for supplying a film forming material.

The supply unit 70 is provided with a cartridge 71 containing a plurality of rod-shaped film forming materials. A linear tube 72 is connected to the cartridge 71. The tube 72 is made of, e.g., quartz. The tube 72 communicates with the cartridge 71, and the lower end thereof serves as a supply port 72a. The rod-shaped silicons are accommodated in the cartridge 71. The rod-shaped silicons accommodated in the cartridge 71 are sequentially supplied to the tube 72.

The heat source 40 is disposed such that the emitted electron beam 40a reaches the spot on the surface of the member P to which the rod-shaped film forming material is supplied from the supply unit 70.

Figure 12:
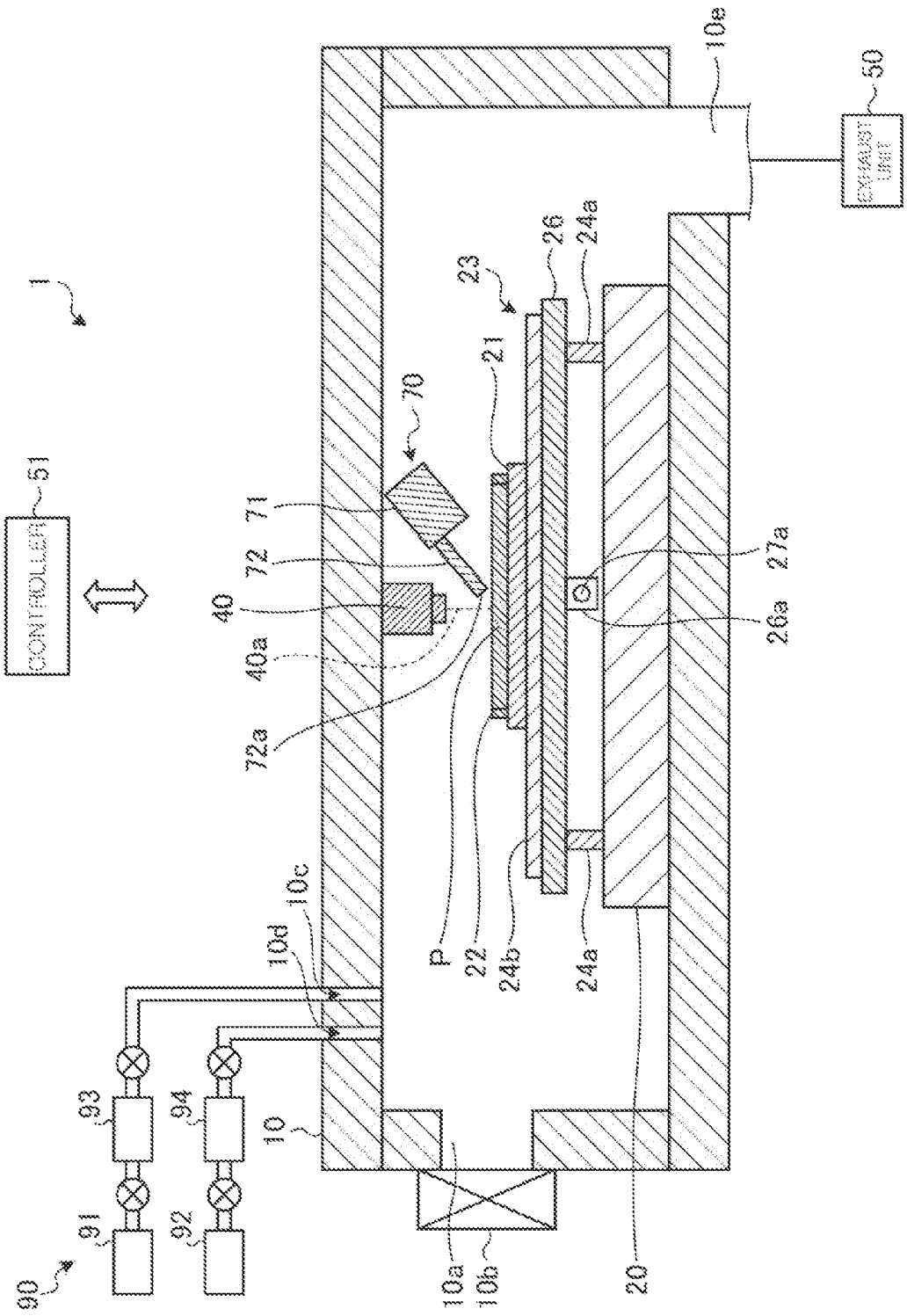
FIG. 12 shows another example of the schematic configuration of the film forming apparatus according to the third embodiment.

In the case of forming a silicon film on the member P as a film forming target member using the film forming apparatus 1 according to the third embodiment, the member P is transferred into the chamber 10 from the opening 10a and placed on the holder 21. In the film forming apparatus 1, the member P placed on the holder 21 is held by the holder 21. In the film forming apparatus 1, the gate valve 10b is closed, and the exhaust unit 50 is driven to reduce the pressure in the chamber 10 to a predetermined vacuum level. For example, in the film forming apparatus 1, the pressure in the chamber 10 is reduced to a level higher than or equal to $10^{-6}$ Torr and lower than $10^{-2}$ Torr, and more preferably to a level higher than or equal to $10^{-5}$ Torr and lower than $10^{-3}$ Torr. If the oxidation can be prevented by introducing the reducing gas or the like into the chamber 10 and forming a film in the reducing gas atmosphere after or while reducing the pressure in the chamber 10, the pressure in the chamber 10 may be $10^{-3}$ Torr or more. FIG. 12 shows another example of the schematic configuration of the film forming apparatus 1 according to the third embodiment. The film forming apparatus shown in FIG. 12 shows a case where the film forming apparatus 1 shown in FIG. 6 is provided with the gas supply system 90 having the same configuration as that of FIG. 10. The reducing gas supply source 91 is configured to supply the reducing gas to the gas introduction port 10c via the flow controller 93, and to introduce the reducing gas into the chamber 10 from the gas introduction port 10c. The dilution gas supply source 92 is configured to supply the dilution gas to the gas introduction port 10d via the flow controller 94, and to introduce the dilution gas into the chamber 10 from the gas introduction port 10d. The film forming apparatus 1 may perform the following film formation in the reducing gas atmosphere by supplying the reducing gas from at least the reducing gas supply source 91 and introducing the reducing gas into the chamber 10 after or while reducing the pressure in the chamber 10. The reducing gas is, for example, a gas containing at least one gas selected from CO gas, $H_2$ gas, $CH_4$ gas, $C_3H_8$ gas, $C_4H_{10}$ gas or the like. In addition, by further supplying a noble gas such as Ar gas, which is the dilution gas, from the dilution gas supply source 92 and introducing the noble gas into the chamber 10, that is, by introducing a gas in which the reducing gas and the noble gas are combined into the chamber 10, the following film formation may be performed.

Figure 7:
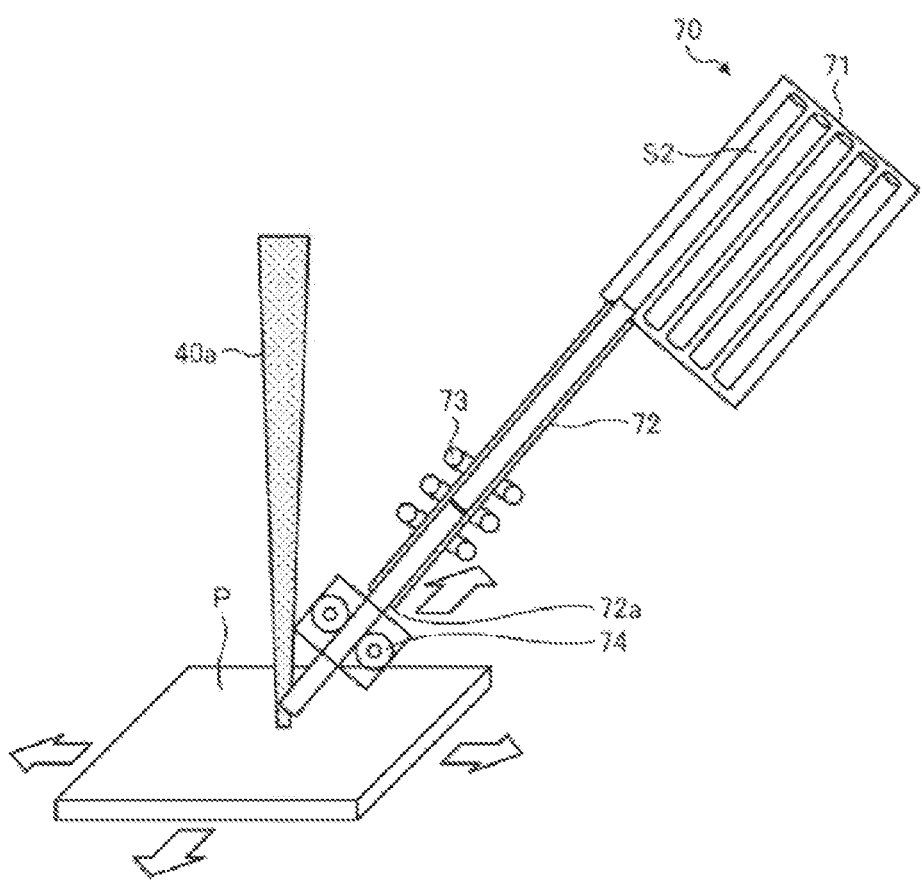
FIG. 7 explains an outline of film formation performed by the film forming apparatus according to the third embodiment.

In the film forming apparatus 1, the film forming material is supplied from the supply unit 70 to the surface of the member P, and the supplied film forming material is melted by the heat source 40 to form a film. FIG. 7 explains an outline of film formation performed by the film forming apparatus 1 according to the third embodiment. In FIG. 7, the cartridge 71 constituting the supply unit 70 is illustrated. The plurality of rod-shaped silicon rods S2 are accommodated in the cartridge 71. The linear tube 72 is connected to the cartridge 71. The silicon rods S2 are sequentially and consecutively supplied from the cartridge 71 to the tube 72. Coils 73 are disposed on the outer periphery of an intermediate portion of the tube 72 toward the supply port 72a. A radio frequency power is supplied from a radio frequency power supply (not shown) to the coils 73 when the end portion of the silicon rod S2 passes through the portion of the tube 72 wound by the coils 73. The ends portions of the consecutively supplied silicon rods S2 are heated and melted by radio frequency induction of the radio frequency power flowing through the coils 73, so that the end portions of adjacent silicon rods S2 are connected to each other. In other words, the silicon rods S2 are consecutively arranged inside the tube 72. The connected silicon rods S2 are outputted from the supply port 72a. The supply unit 70 has a pair of transfer rollers 74 at the end of the supply port 72a. The pair of transfer rollers 74 has the silicon rod S2 interposed therebetween, and the rotation thereof can be controlled by a motor (not shown). The supply unit 70 is configured to adjust the supply amount of the silicon rod S2 by changing the rotation speed of the transfer rollers 74.

The silicon rod S2 transferred by the transfer rollers 74 is supplied to the surface of the member P. The heat source 40 irradiates the electron beam 40a to a spot where the silicon rod S2 is in contact with the surface of the member P. Hence, the silicon rod S2 is heated and melted by the electron beam 40a emitted from the heat source 40, thereby forming a silicon film.

The member P is configured to be movable on the upper surface of the placement table 20 by the driving unit 23. The film forming apparatus 1 forms a silicon film on the surface of the member P while moving the spot where the silicon film will be formed on the member P by moving the holder 21 holding the member P using the driving unit 23.

In this manner, the film forming apparatus 1 according to the third embodiment can form a silicon film in the depressurized chamber 10 while suppressing oxidation of silicon. Further, after or while reducing the pressure in the chamber 10, by introducing the reducing gas or the like into the chamber 10 from the gas introduction ports 10c and 10d and melting the film forming material in the reducing gas atmosphere to form a film, it is possible to form the silicon film while suppressing oxidation of silicon.

As described above, the supply unit 70 supplies the rod-shaped film forming material (the silicon rod S2). The supply unit 70 supplies the film forming material from one or more directions. The supply unit 70 supplies the film forming material using the rollers (the transfer rollers 74). Accordingly, the film forming apparatus 1 can form a film on the surface of the film forming target member while suppressing oxidation even in the case of using a rod-shaped film forming material.

The supply unit 70 sequentially supplies a plurality of rod-shaped film forming materials to the tube 72. The end portions of the film forming materials are heated by the heating mechanism disposed in the tube 72, so that end portions of the film forming materials are bonded together and the film forming materials are supplied. Accordingly, the film forming apparatus 1 can constantly and stably supply the film forming material even in the case of supplying the rod-shaped film forming material.

Fourth Embodiment

Figure 8:
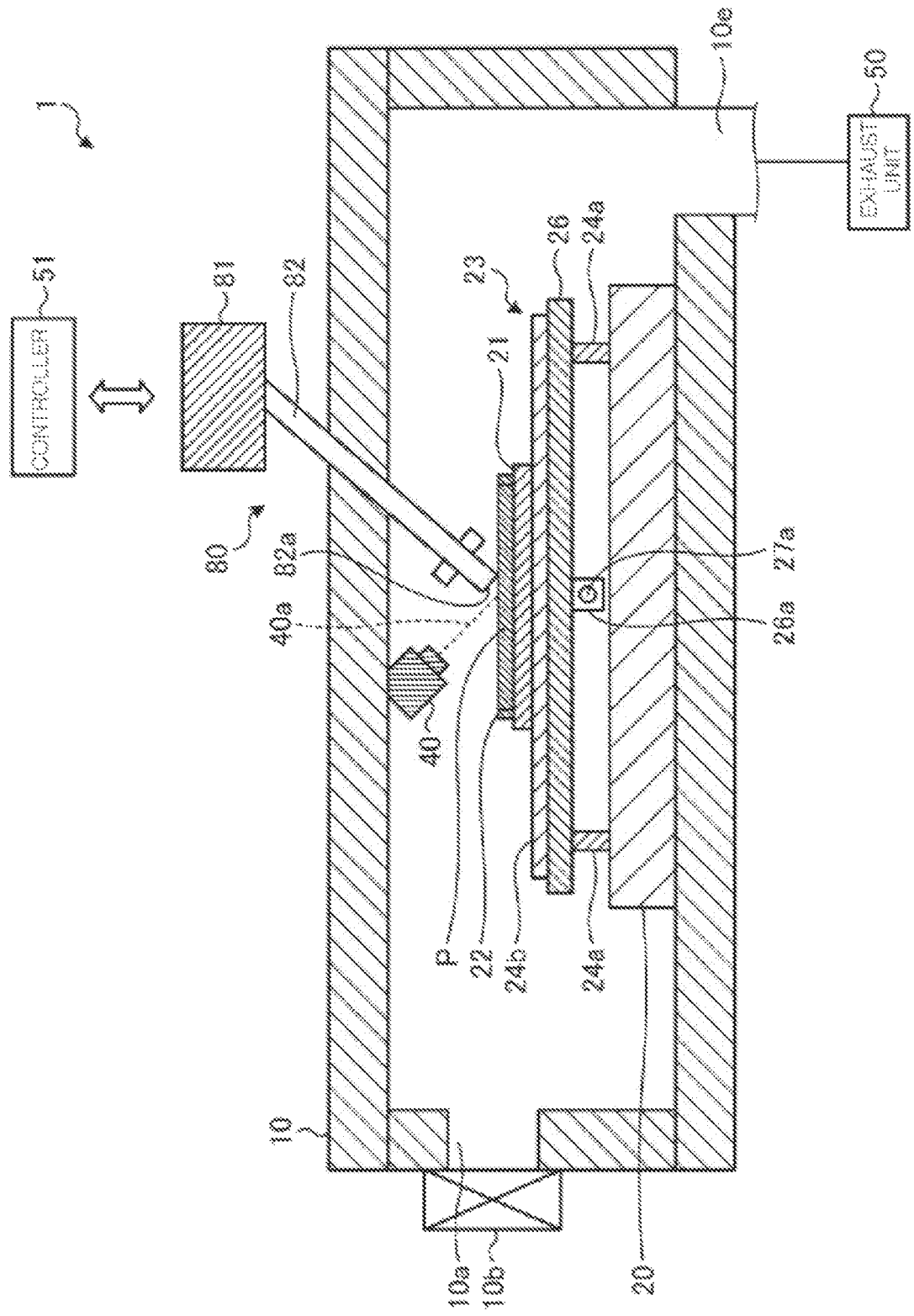
FIG. 8 shows an example of a schematic configuration of a film forming apparatus according to a fourth embodiment.

Next, a fourth embodiment will be described. FIG. 8 shows an example of a schematic configuration of a film forming apparatus 1 according to the fourth embodiment. Since the film forming apparatus 1 according to the fourth embodiment has the same configuration in part as those of the film forming apparatuses 1 according to the first to third embodiments shown in FIGS. 1, 4 and 6, like reference numerals will be used for like parts. The redundant description will be omitted, and differences will be mainly described. The film forming apparatus 1 according to the fourth embodiment includes a supply unit 80 for supplying a film forming material.

The supply unit 80 is disposed above the placement table 20. The supply unit 80 is airtightly disposed at the ceiling portion of the chamber 10. The supply unit 80 has a heating container 81 accommodating a film forming material. The heating container 81 accommodates silicon, as a film forming material, maintained in a liquid state by heating it. A linear nozzle 82 is connected to a lower portion of the heating container 81. The nozzle 82 is made of, e.g., quartz. The nozzle 82 communicates with the heating container 81, and the lower end thereof serves as a supply port 82a. The liquid silicon contained in the heating container 81 is cooled by the nozzle 82, hardened in a rod shape, and supplied into the chamber 10 through the nozzle 82.

The heat source 40 is disposed such that the emitted electron beam 40a reaches the spot on the surface of the member P to which the rod-shaped film forming material is supplied from the supply unit 80.

Figure 13:
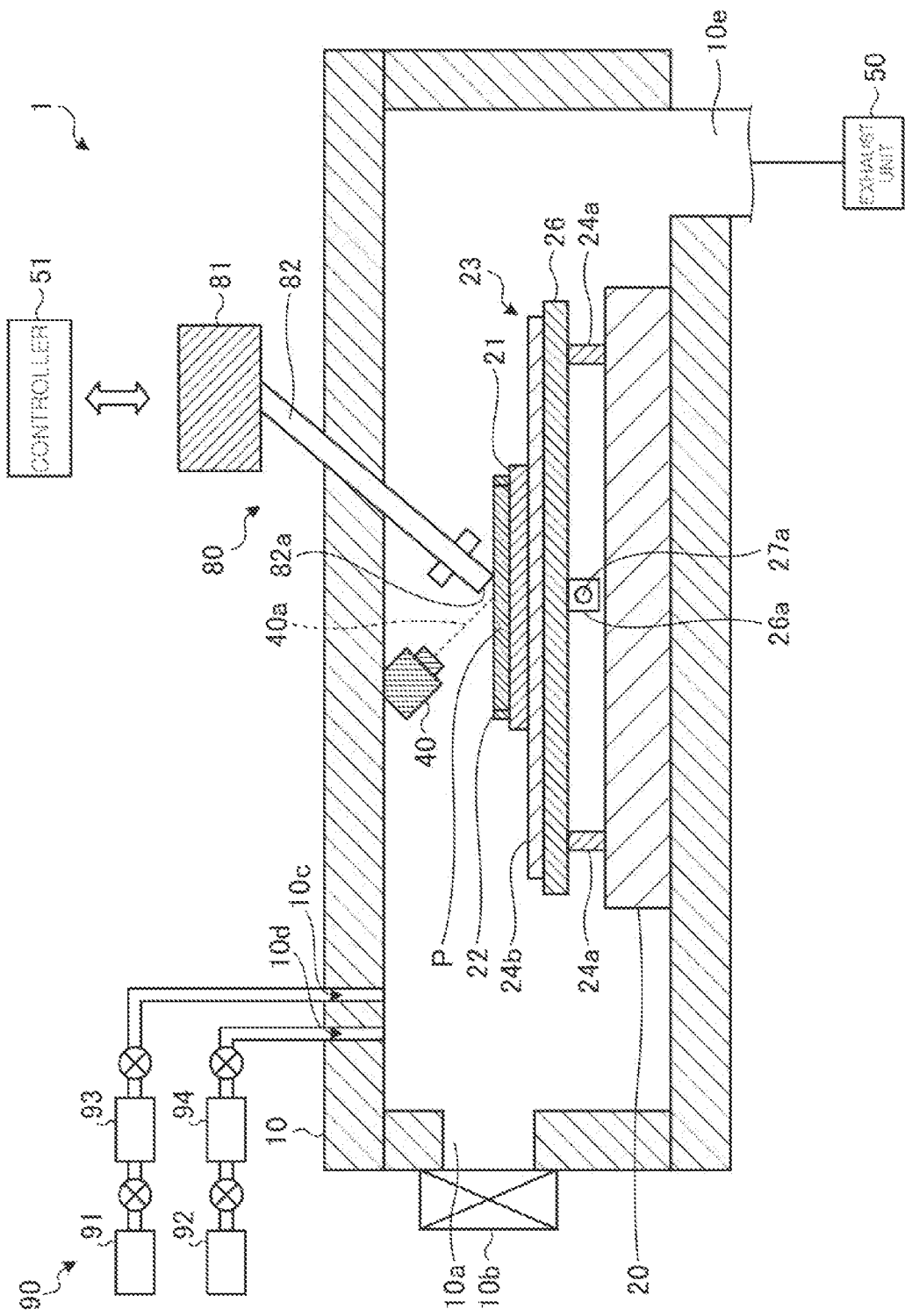
FIG. 13 shows another example of the schematic configuration of the film forming apparatus according to the fourth embodiment.

In the case of forming a silicon film on the member P as a film forming target member using the film forming apparatus 1 according to the fourth embodiment, the member P is transferred into the chamber 10 from the opening 10a and placed on the holder 21. In the film forming apparatus 1, the member P placed on the holder 21 is held by the holder 21. In the film forming apparatus 1, the gate valve 10b is closed, and the exhaust unit 50 is driven to reduce the pressure in the chamber 10 to a predetermined vacuum level. For example, the film forming apparatus 1 reduces the pressure in the chamber 10 to a level higher than or equal to $10^{-6}$ Torr and lower than $10^{-2}$ Torr, and more preferably to a level higher than or equal to $10^{-5}$ Torr and lower than $10^{-3}$ Torr. If the oxidation can be prevented by introducing the reducing gas or the like into the chamber 10 and forming a film in the reducing gas atmosphere after or while reducing the pressure in the chamber 10, the pressure in the chamber 10 may be $10^{-3}$ Torr or more. FIG. 13 shows another example of the schematic configuration of the film forming apparatus 1 according to the fourth embodiment. The film forming apparatus 1 shown in FIG. 13 shows a case where the film forming apparatus 1 shown in FIG. 8 is provided with the gas supply system 90 having the same configuration as that of FIG. 10. The reducing gas supply source 91 is configured to supply the reducing gas to the gas introduction port 10c via the flow controller 93, and to introduce the reducing gas into the chamber 10 from the gas introduction port 10c. The dilution gas supply source 92 is configured to supply the dilution gas to the gas introduction port 10d via the flow controller 94, and to introduce the dilution gas into the chamber 10 from the gas introduction port 10d. The film forming apparatus 1 may perform the following film formation in the reducing gas atmosphere by supplying the reducing gas from at least the reducing gas supply source 91 and introducing the reducing gas into the chamber 10 after or while reducing the pressure in the chamber 10. The reducing gas is, for example, a gas containing at least one gas selected from CO gas, $H_2$ gas, $CH_4$ gas, $C_3H_8$ gas, $C_4H_{10}$ gas or the like. In addition, by further supplying a noble gas such as Ar gas, which is the dilution gas, from the dilution gas supply source 92 and introducing the noble gas into the chamber 10, that is, by introducing a gas in which the reducing gas and the noble gas are combined into the chamber 10, the following film formation may be performed.

Figure 9:
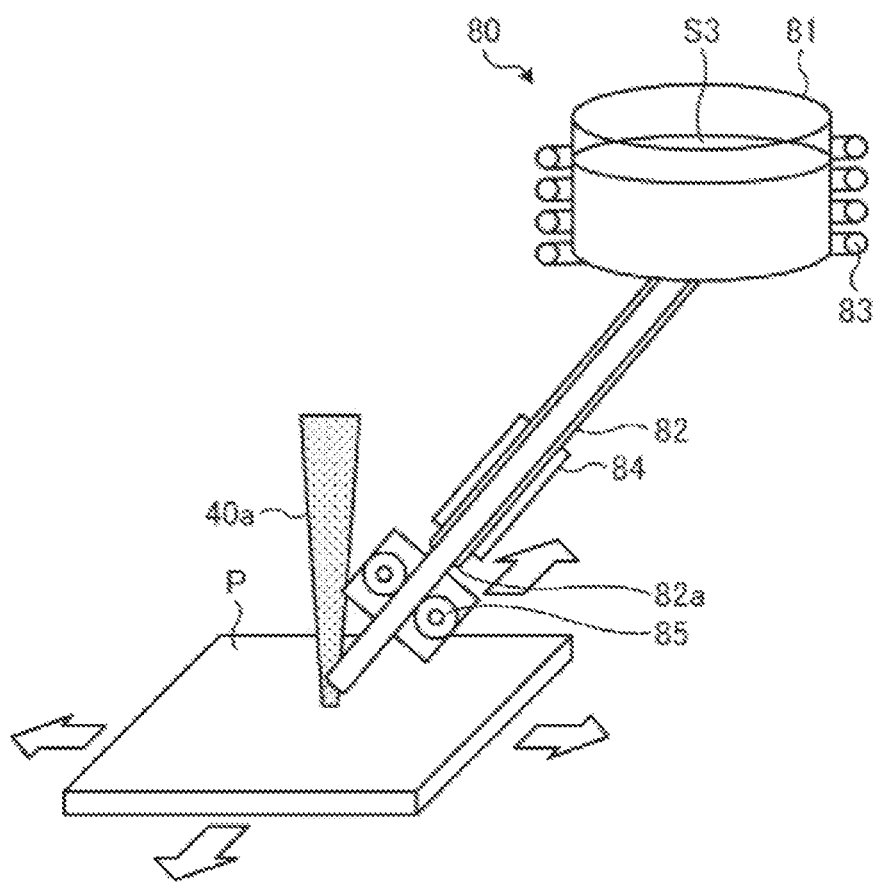
FIG. 9 explains an outline of film formation performed by the film forming apparatus according to the fourth embodiment.

In the film forming apparatus 1, the film forming material is supplied from the supply unit 80 to the surface of the member P, and the supplied film forming material is melted by the heat source 40 to form a film. FIG. 9 explains an outline of film formation performed by the film forming apparatus 1 according to the fourth embodiment. In FIG. 9, the heating container 81 and the nozzle 82 constituting supply unit 80 are illustrated. Silicon S3 is stored in the heating container 81, and coils 83 are disposed along the circumferential surface of the heating container 81. A radio frequency power is supplied from a radio frequency power supply (not shown) to the coils 83. The heating container 81 heats the silicon S3 by radio frequency induction of the radio frequency power flowing through the coils 83, so that the silicon S3 in a liquid state is accommodated in the heating container 81.

The nozzle 82 is connected to the heating container 81. The nozzle 82 has a water cooling line 84 at the outer periphery of an intermediate portion toward the supply port 82a, so that the intermediate portion of the nozzle 82 is cooled. The liquid silicon S3 flowing into the nozzle 82 is cooled at the intermediate portion and becomes solid silicon with a rod shape. Therefore, the rod-shaped silicon S3 is outputted from the supply port 82a. The supply unit 80 has a pair of transfer rollers 85 at the end of the supply port 82a. The pair of transfer rollers 85 has the rod-shaped silicon S3 interposed therebetween, and the rotation thereof can be controlled by a motor (not shown). The supply unit 80 can adjust the supply amount of the silicon S3 by changing the rotation speed of the transfer rollers 85.

The silicon S3 drawn out by the transfer rollers 85 is supplied to the surface of the member P. The heat source 40 irradiates the electron beam 40a to a spot where the silicon S3 is in contact with the surface of the member P. Accordingly, the silicon S3 is heated and melted by the electron beam 40a emitted from the heat source 40, thereby forming a silicon film.

The member P is configured to be movable on the upper surface of the placement table 20 by the driving unit 23. The film forming apparatus 1 forms a silicon film on the surface of the member P while moving the spot where the silicon film will be formed on the member P by moving the holder 21 holding the member P using the driving unit 23.

In this manner, the film forming apparatus 1 according to the fourth embodiment can form a silicon film in the depressurized chamber 10 while suppressing oxidation of silicon. Further, after or while reducing the pressure in the chamber 10, by introducing the reducing gas or the like into the chamber 10 from the gas introduction ports 10c and 10d and melting the film forming material in the reducing gas atmosphere to form a film, it is possible to form the silicon film while suppressing oxidation of silicon.

As described above, in the supply unit 80, the film forming material is melted in the heating container 81, and the melted film forming material flows into the nozzle 82 and is molded and supplied in a rod shape. Accordingly, the film forming apparatus 1 can constantly and stably supply a film forming material.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures.

For example, in the above-described embodiments, the case where film formation is performed while driving the holder 21 on the upper surface of the placement table 20 using the driving unit 23 has been described as an example. However, the present disclosure is not limited thereto. The film forming apparatus 1 may perform film formation while driving the driving unit 23 to move the supply units 30, 60, 70, and 80 and the heat source 40 with respect to the placement table 20.

In the second embodiment, the case where the two robot arms 61a and 61b grip and supply the rod-shaped film forming materials has been described as an example. However, the present disclosure is not limited thereto. In the film forming apparatus 1, three robot arms may grip and supply rod-shaped film forming materials.

Further, in the film forming apparatus 1 of the above-described embodiment, cooling after the film formation may be controlled by sufficient pre-heating. For example, in the film forming apparatus 1, a heater may be disposed in an area of the holder 21 that is in contact with the member P to control the cooling after the film formation. A cooling rate at which cracks are not generated in the formed silicon film is determined by a test or the like, and the cooling is performed at the determined cooing rate. Accordingly, it is possible to prevent cracks from being generated at the formed silicon film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A film forming apparatus comprising:
   a chamber;
   an exhaust unit configured to reduce the pressure in the chamber to a predetermined vacuum level;
   a holder disposed in the chamber and configured to hold a film forming target member on which a film is to be formed;
   a supply unit configured to supply a film forming material containing silicon to a surface of the film forming target member;
   a heat source configured to perform heating at the predetermined vacuum level to melt the supplied film forming material; and
   a controller, wherein the controller is configured to control the apparatus to provide the predetermined vacuum level in the chamber by the exhaust unit during supply of the film forming material containing silicon by the supply unit and during the heating by the heat source.

2. The film forming apparatus of claim 1, wherein the heat source is configured to heat a spot on the surface of the film forming target member where the film forming material is supplied from the supply unit, and
   the film forming apparatus further comprises:
   a driving unit configured to drive the holder, or the supply unit and the heat source such that the spot moves on the surface of the film forming target member.

3. The film forming apparatus of claim 1, wherein the controller is configured to control the exhaust unit to reduce the pressure in the chamber to a level higher than or equal to $10^{-6}$ Torr and lower than $10^{-2}$ Torr.

4. The film forming apparatus of claim 3, wherein the controller is configured to control the exhaust unit reduces to reduce the pressure in the chamber to a level higher than or equal to $10^{-5}$ Torr and lower than $10^{-3}$ Torr.

5. The film forming apparatus of claim 1, wherein the heat source outputs an electron beam or laser to melt the film forming material.

6. The film forming apparatus of claim 1, wherein the supply unit is configured to supply the film forming material made of a powder.

7. The film forming apparatus of claim 6, wherein the supply unit accommodates the powder film forming material in an accommodating part disposed above the holder, the width of the accommodating part becoming gradually narrower downwards, and supplies the film forming material from a supply port disposed under the accommodating part and communicating with the accommodating part.

8. The film forming apparatus of claim 1, wherein the supply unit is configured to supply the film forming material having a rod shape.

9. The film forming apparatus of claim 8, wherein the supply unit supplies is configured to supply the film forming material from one or more directions.

10. The film forming apparatus of claim 8, wherein the supply unit is configured to grip and supply the rod-shaped film forming material using a plurality of robot arms.

11. The film forming apparatus of claim 8, wherein the supply unit supplies the film forming material using rollers.

12. The film forming apparatus of claim 8, wherein the supply unit is configured to sequentially supply a plurality of rod-shaped film forming materials to a tube, heat an end portion of each of the rod-shaped film forming materials using a heating mechanism provided in the tube, bond the end portions of the rod-shaped film forming materials, and supply the rod-shaped film forming materials.

13. The film forming apparatus of claim 8, wherein the supply unit is configured to melt the film forming material in a heating container and allow the melted film forming material to flow through a nozzle so as to be molded and supplied in a rod shape.

14. The film forming apparatus of claim 1,
wherein the controller is configured to control the apparatus to introduce a reducing gas into the chamber.

15. The film forming apparatus of claim 1, wherein the heat source is disposed in the chamber.

16. The film forming apparatus of claim 1, wherein the heat source is disposed outside the chamber.

17. The film forming apparatus of claim 16, wherein an electron beam or laser light emitted from the heat source is guided into the chamber by a light guide member, so as to be irradiated to the film forming target member.

18. The film forming apparatus of claim 17, wherein the light guide member is one of a mirror, a lens, a transmission window or an optical fiber.

19. The film forming apparatus of claim 14, further comprising:
a gas introduction port for introducing a dilution gas into the chamber.

20. The film forming apparatus of claim 19, wherein the dilution gas is a noble gas.

21. The film forming apparatus of claim 1, further comprising a gas supply configured to supply a reducing gas to the chamber, and wherein the controller is configured to control the apparatus to supply the reducing gas into the chamber to form the film in a reducing gas atmosphere.

22. The film forming apparatus of claim 21, wherein the gas supply supplies the reducing gas containing at least one gas selected from CO gas, $H_2$ gas, $CH_4$ gas, $C_3H_8$ gas and $C_4H_{10}$ gas.

23. The film forming apparatus of claim 1,
wherein the holder comprises a heater,
and wherein the controller is configured to control the heater to pre-heat before a film formation and to control the heater to cool a formed silicon film at a cooling rate at which cracks are not generated in the formed silicon film after the film formation.

24. The film forming apparatus of claim 1, wherein the film forming target member is a component in a chamber of a semiconductor manufacturing apparatus.

25. The film forming apparatus of claim 24, wherein the film forming target member is one of an edge ring, an upper electrode, an exhaust ring and a deposition shield.

* * * * *